United States Patent
Hama et al.

(10) Patent No.: US 6,924,001 B2
(45) Date of Patent: Aug. 2, 2005

(54) PRODUCTION DEVICE FOR DLC FILM-COATED PLASTIC CONTAINER AND PRODUCTION METHOD THEREFOR

(75) Inventors: Kenichi Hama, Tokyo (JP); Tsuyoshi Kage, Tokyo (JP); Takumi Kobayashi, Singapore (SG); Tomoyuki Araki, Nagareyama (JP)

(73) Assignees: Mitsubishi Shoji Plastics Corporation, Tokyo (JP); Youtec Co., Ltd., Chiba (JP)

( * ) Notice: Subject to any disclaimer, the term of this patent is extended or adjusted under 35 U.S.C. 154(b) by 0 days.

(21) Appl. No.: 10/433,343

(22) PCT Filed: Dec. 25, 2000

(86) PCT No.: PCT/JP00/09202

§ 371 (c)(1),
(2), (4) Date: May 30, 2003

(87) PCT Pub. No.: WO02/051707

PCT Pub. Date: Jul. 4, 2002

(65) Prior Publication Data

US 2004/0099214 A1 May 27, 2004

(51) Int. Cl.⁷ .............................. B05D 7/22; C23C 16/26; C23C 16/458; C23C 16/507; C23C 16/509
(52) U.S. Cl. .................... 427/237; 427/577; 427/249.7; 427/906; 118/719; 118/723 E
(58) Field of Search ............................ 427/577, 237, 427/249.7, 569, 585, 906; 118/723 R, 719

(56) References Cited

U.S. PATENT DOCUMENTS 3,616,458 A  *  10/1971  Moriya .................. 422/186.05
4,746,538 A  *  5/1988  Mackowski .................. 427/577
5,565,248 A  *  10/1996  Plester et al. ................ 427/571
5,798,139 A  *  8/1998  Nagashima et al. ......... 427/237
6,294,226 B1 *  9/2001  Shimamura .................. 427/577

FOREIGN PATENT DOCUMENTS

| JP | 07019750 A | * | 1/1995 | ............. F27B/1/26 |
| JP | 07-19750 B2 | | 3/1995 | |
| JP | 08-053117 A | | 2/1996 | |
| JP | 08-260157 | | 10/1996 | |
| JP | 08260157 A | * | 10/1996 | ........... C23C/16/50 |
| JP | 10-226884 A | | 8/1998 | |
| JP | 10-258825 A | | 9/1998 | |
| JP | 10258825 A | * | 9/1998 | ............. B65D/1/09 |

* cited by examiner

*Primary Examiner*—Timothy Meeks
*Assistant Examiner*—Wesley D. Markham
(74) *Attorney, Agent, or Firm*—Hedman & Costigan, P.C.

(57) ABSTRACT

A production device for a DLC film-coated plastic container and a production method therefor, capable of forming DLC (diamond-like carbon) films simultaneously on the inner surfaces of a plurality of plastic containers, and reducing variations in film thickness. A production device for DLC film-coated plastic containers, for forming a plurality DLC films simultaneously, characterized by comprising a columnar external electrode (3) having housing spaces in which a plurality of plastic containers (7a–7d) can be disposed in parallel and independently, internal electrodes (9a–9d) respectively disposed in the housed containers (7a–7d), a matching box (14) connected to the external electrode (3) and impedance-matching a high-frequency load, and a high-frequency power supply (15) connected to the matching box.

9 Claims, 6 Drawing Sheets

(a)                (b)

(a)

(b)

PRODUCTION DEVICE FOR DLC FILM-COATED PLASTIC CONTAINER AND PRODUCTION METHOD THEREFOR

TECHNICAL FIELD

The present invention is related to an apparatus for manufacturing DLC film coated plastic containers in which a DLC film is formed on the inner surfaces of plastic containers, and a manufacturing method thereof, and in particular to a manufacturing apparatus which simultaneously coats a plurality of plastic containers with a uniform DLC film, and a manufacturing method thereof.

PRIOR ART TECHNOLOGY

Japanese Laid-Open Patent Publication No. HEI 8-53117 discloses a vapor deposition apparatus which uses CVD (Chemical Vapor Deposition, chemical vapor growing method), in particular, a plasma CVD method to vapor deposit a DLC (Diamond Like Carbon) film on the inner surface of a plastic container in order to improve the gas barrier properties and the like of containers such as containers for carbonated beverages and high fruit juice beverages and the like. Further, Japanese Laid-Open Patent Publication No. HEI 10-258825 discloses a manufacturing apparatus for mass producing a DLC film coated plastic container, and a manufacturing method thereof. Furthermore, Japanese Laid-Open Patent Publication No. HEI 10-226884 discloses a manufacturing apparatus which makes it possible to apply a coating of DLC film without mottling to a container having protrusions which protrude from the outer surface to the outside, and a manufacturing method thereof.

A DLC film is a film called an i-carbon film or an amorphous carbon hydride film (a-C:H), and also includes a hard carbon film. Further, a DLC film is an amorphous-state carbon film, and includes $SP^3$ bonding and $SP^2$ bonding.

In order to carry out mass production, Japanese Laid-Open Patent Publication No. HEI 10-258825 discloses a manufacturing apparatus which coats a plurality of plastic containers with a DLC film at one time, and a manufacturing method thereof. However, in this technology, because an external electrode is provided for each one bottle, the number of external electrode components needs to be the same as the number of bottles, and for this reason, the total number of components used becomes large, and this has resulted in higher costs. Further, because it is difficult to distribute a high-frequency output equally to each external electrode, it has been difficult to apply a uniform DLC film over all of the plurality of plastic containers. In this kind of case, one matching box (impedance matching unit) is arranged per one plastic container, and by using a plurality of matching boxes, a DLC film is finally applied to the plurality of plastic containers.

SUMMARY OF THE INVENTION

When a plurality of matching boxes is arranged in this way, because even compact matching boxes have a size of about 300 mm×300 mm×400 mm, the plasma source becomes very large, and this becomes a hindrance to making a compact apparatus. Accordingly, a wide space is required for setting up an apparatus for manufacturing DLC film coated plastic containers for mass production, and this creates a poor space efficiency. Together with this, because matching boxes are expensive items, the cost of the apparatus increases.

Further, when matching boxes are provided for each of the external electrodes housing the plastic containers, because there will be minute differences between the matching times created by the matching boxes, it is not possible to precisely match the matching times with each other. Specifically, a mutual lag of about 0.1~1 second is created in the impedance matching in each matching box. Now, because the film thickness of the DLC film formed on the inner surfaces of the plastic containers is thin at about 30 nm, about 3 seconds is sufficient for the film forming time, and for this reason the forming of films needs to be controlled with relatively good precision. Consequently, the matching time lag of about 0.1~1 second has a large effect on the dispersion of film thicknesses of the DLC films, especially, the film thickness dispersion between the plastic containers. Accordingly, this creates a dispersion in the quality of the DLC films.

In view of the problems described above, it is an object of the present invention to provide an apparatus for manufacturing DLC film coated plastic containers and a manufacturing method thereof which make it possible to simultaneously form DLC films on the inner surfaces of a plurality of plastic containers to achieve high productivity, and which uses a multiple-integrated external electrode to make it possible to reduce the number of external electrode structural components, build a compact apparatus by simplifying the structure, achieve easy maintenance, reduce the cost of the apparatus, and reduce the film thickness dispersion.

In this regard, the multiple-integrated external electrode described in the present invention has the same function as a multiple type external electrode in which there is a plural arrangement of a combined structure of a matching box and an external electrode of the type that houses only one plastic container, and refers to an integrated type external electrode which makes it possible to house a plurality of plastic containers inside one external electrode, wherein one matching box is used for such one integrated type external electrode.

It is a second object of the present invention to provide an apparatus for manufacturing DLC film coated plastic containers and a manufacturing method thereof which make it possible to further increase the number of plastic containers undergoing film formation at one time. In this regard, even when the number of plastic containers undergoing film formation at one time is increased, it is an object to also prevent obstruction to the conveying in of plastic containers and the conveying out of DLC film coated plastic containers. Further, it is an object to also make the film forming portion smaller and reduce the cost of a manufacturing apparatus for mass production by using variable capacitors and using only one matching box. In this regard, the reason for using variable capacitors is described below. Namely, in the case where film formation is simultaneously carried out using a plurality of external electrodes housing one container arranged in parallel, a matching box for obtaining impedance matching needs to be provided for each external electrode. However, in order to avoid using a plurality of matching boxes, the same results can be obtained using only one matching box by adjusting the power distribution between each multiple-integrated external electrode with variables capacitors. Further, it is an object to also precisely match the matching times by preventing lags in the matching times, and reduce the dispersion of the film thickness of the formed DLC films between containers. Of course, it is an object to also provide an apparatus for manufacturing DLC film coated plastic containers and a manufacturing method thereof which make it unnecessary for the multiple-integrated external electrode to carry out the adjustment of the power distribution between each external electrode which is an essential requirement in the case where an external electrode is provided for each one container.

It is a third object of the present invention to provide an apparatus for manufacturing DLC film coated plastic containers which has a simple structure and a manufacturing method thereof, wherein the connection between a multiple-integrated external electrode and a matching box, or the connection between multiple-integrated external electrodes and variable capacitors in the case where variable capacitors are used is carried out at a point equidistant from each plastic container when the plurality of plastic container housing spaces are arranged at equal distances on the same circle in the same cross section of the multiple-integrated external electrode, namely, at the center of such circle. For example, in the case where a connection between a multiple-integrated external electrode and a matching box is carried out, because power can be distributed uniformly inside the multiple-integrated external electrode, it is an object to form DLC films uniformly in a plurality of plastic containers without the use of variable capacitors. On the other hand, even in the case where variable capacitors are used, it is an object to make it possible to eliminate the need to provide the same number of variable capacitors as the number of plastic containers housed at one time by using the same number of variable capacitors as the number of multiple-integrated external electrodes.

Further, the containers according to the present invention are containers which use a cover or a stopper or a seal, and include containers used in an open state which do not use these. The size of the opening is determined according to the contents. The plastic containers include plastic containers having a prescribed thickness which have moderate rigidity, and plastic containers formed from a sheet material having no rigidity. Further, the covers of containers are also included.

The substances filled into the plastic containers according to the present invention can be beverages such as carbonated beverages or fruit juice beverages or soft drinks or the like, as well as medicines, agrichemicals, or dried foods which hate moisture absorption or the like.

In order to solve the problems described above, the apparatus for manufacturing DLC film coated plastic containers according to the present invention is an apparatus for manufacturing DLC film coated plastic containers which simultaneously forms a DLC film on the inside surfaces of a plurality of plastic containers, and includes:

a columnar external electrode which includes housing spaces capable of housing said plurality of plastic containers in parallel in respective independently housed states, and is a columnar external electrode formed from a single columnar body in which the inner wall surface of each of the housing spaces is shaped to surround the vicinity of the outside of the plastic container, wherein the center axis of each of the housing spaces is parallel to the center axis of the columnar external electrode, and is positioned on the same circle in the same cross section of the columnar external electrode, and wherein the fellow housing spaces are arranged at equal spacings;

internal electrodes respectively arranged inside the plurality of plastic containers housed in the housing spaces of the columnar external electrode;

source gas introduction means which introduces a source gas inside each of the plurality of plastic containers;

a matching box which carries out impedance matching of high-frequency loads connected to the columnar external electrode; and a high-frequency power supply connected to the matching box.

In this regard, a columnar external electrode formed from one columnar body refers to the external electrode integrated to have a single columnar shape like that shown in FIGS. 2(a) and 2(b), FIGS. 4(a) and 4(b) or FIG. 6.

The external electrode used by the manufacturing apparatus of the present invention can use any columnar electrode, but preferably the external electrode has a cylindrical shape or a columnar structure formed from a single columnar body and formed by combining shapes which surround each container housing space with an approximately uniform thickness.

The columnar external electrode of the present invention includes housing spaces capable of housing said plurality of plastic containers in parallel in respective independently housed states, and is a columnar external electrode formed from a single columnar body in which the inner wall surface of each of the housing spaces is shaped to surround the vicinity of the outside of the plastic container, wherein the center axis of each of the housing spaces is parallel to the center axis of the columnar external electrode, and is positioned on the same circle in the same cross section of the columnar external electrode, and wherein the fellow housing spaces are arranged at equal spacings, namely, the columnar external electrode is a multiple-integrated external electrode having a multiple-integrated structure. However, the multiple-integrated external electrode is not limited to a structure in which a plurality of housing spaces are provided in the same member from the reason of electrode manufacture or the like, and includes structures provided with housing spaces wherein a plurality of members are connected as a precondition of ensuring electrical conductivity.

The place where the columnar external electrode and the output side of the matching box are connected can be changed within a range in which a plasma is generated uniformly inside all the containers. For example, connections may be divided respectively near the bottom portion of each plastic container inside the columnar external electrode. However, in the apparatus for manufacturing DLC film coated plastic containers according to the present invention, the output side of the matching box is preferably connected at the center axis of the columnar external electrode. Further, if a connection is made on such center axis, the connection point may be provided on the surface of the columnar external electrode or inside the columnar external electrode.

The number of plastic container housing spaces provided in one columnar external electrode can be two or more, but in view of the conveying in and conveying out characteristics by the conveyor of the containers, there is two spaces, and more preferably four spaces. In the case where a film is to be formed simultaneously on more containers than this, a plurality of columnar external electrodes is preferably provided.

Further, the source gas is preferably a hydrocarbon gas or a hydrocarbon type gas containing Si. In particular, acetylene, propylene and ethylene are preferred.

Further, another apparatus for manufacturing DLC film coated plastic containers according to the present invention is an apparatus for manufacturing DLC film coated plastic containers which simultaneously forms a DLC film on the inside surfaces of a plurality of plastic containers, and includes:

a plurality of columnar external electrodes which include housing spaces capable of housing said plurality of plastic containers in parallel in respective independently housed states, and are columnar external electrodes formed from a single columnar body in which the inner wall surface of each of the housing spaces is shaped to surround the vicinity of the outside of the plastic container, wherein the center axis of each of the housing spaces is parallel to the center axis of the columnar external electrode, and is positioned on the same circle in the same cross section of the columnar external electrode, and wherein the fellow housing spaces are arranged at equal spacings;

internal electrodes respectively arranged inside the plurality of plastic containers housed in the housing spaces of the columnar external electrodes;

source gas introduction means which introduces a source gas inside each of the plurality of plastic containers;

variable capacitors connected to each of the columnar external electrodes;

one matching box which carries out impedance matching of high-frequency loads connected to the variable capacitors; and a high-frequency power supply connected to the matching box;

wherein the matching box carries out impedance matching of all of the plurality of columnar external electrodes, and the variable capacitors carry out distribution of a high-frequency output supplied to each of the columnar external electrodes by the high-frequency power supply.

As described above, the present invention provided with a plurality of columnar external electrodes is preferred in the case where a film is to be formed in more than four containers at one time. In view of the conveying in and conveying out characteristics of the conveyor of the containers, four container housing spaces is preferably provided per one columnar external electrode, and a plurality of such columnar external electrodes is provided preferably.

The place where the columnar external electrodes and the output sides of the variable capacitors are connected can be changed within a range in which a plasma is generated uniformly inside all the containers in all the columnar external electrodes. For example, connections may be divided respectively near the bottom portion of each plastic container inside the columnar external electrode. In the apparatus for manufacturing DLC film coated plastic containers according to the present invention, the output sides of the variable capacitors are preferably connected at the center axes of the columnar external electrodes. Further, if connections are made on such center axis, the connection points may be provided on the surfaces of the columnar external electrodes or inside the columnar external electrodes.

The external electrodes used by the manufacturing apparatus of the present invention can use any columnar electrodes, but preferably the external electrodes have a cylindrical shape or a columnar structure formed by combining shapes which surround each container housing space with an approximately uniform thickness.

The method of manufacturing DLC film coated plastic containers according to the present invention is a method of manufacturing DLC film coated plastic containers which simultaneously forms a DLC film on the inside surfaces of a plurality of plastic containers, and includes the steps of:

supplying a uniformly distributed high-frequency output to housing spaces provided in a columnar external electrode which includes the housing spaces capable of housing said plurality of plastic containers in parallel in respective independently housed states, and which is a columnar external electrode formed from a single columnar body in which the inner wall surface of each of the housing spaces is shaped to surround the vicinity of the outside of the plastic container, wherein the center axis of each of the housing spaces is parallel to the center axis of the columnar external electrode, and is positioned on the same circle in the same cross section of the columnar external electrode, and wherein the fellow housing spaces are arranged at equal spacings; and generating a source gas type plasma between the columnar external electrode and grounded internal electrodes respectively arranged inside the plurality of plastic containers housed in the housing spaces of the columnar external electrode.

In the method of manufacturing DLC film coated plastic containers according to the present invention, a high-frequency output is preferably supplied at the center axis of the columnar external electrode.

Further, another method of manufacturing DLC film coated plastic containers according to the present invention is a method of manufacturing DLC film coated plastic containers which simultaneously forms a DLC film on the inside surfaces of a plurality of plastic containers, and includes the steps of:

supplying a uniformly distributed high-frequency output to each of a plurality of columnar external electrodes which include housing spaces capable of housing said plurality of plastic containers in parallel in respectively independently housed states, and which are columnar external electrodes formed from a single columnar body in which the inner wall surface of each of the housing spaces is shaped to surround the vicinity of the outside of the plastic container, wherein the center axis of each of the housing spaces is parallel to the center axis of the columnar external electrode, and is positioned on the same circle in the same cross section of the columnar external electrode, and wherein the fellow housing spaces are arranged at equal spacings;

supplying the uniformly distributed high-frequency output to the housing spaces provided in each of the columnar external electrodes; and generating a source gas type plasma between each of the columnar external electrodes and grounded internal electrodes respectively arranged inside the plurality of plastic containers housed in the housing spaces of the columnar external electrodes.

In the method of manufacturing DLC film coated plastic containers according to the present invention, the supply and distribution of the high-frequency output to each of the columnar external electrodes is carried out via variable capacitors, and the supply and distribution of the high-frequency output to each plastic container housing space is preferably carried out at the center axes of the columnar external electrodes.

By the inventions of the apparatus for manufacturing DLC film coated plastic containers and the manufacturing method thereof, it is possible to form DLC films simultaneously on the inner surfaces of a plurality of plastic containers, and this makes it possible to manufacture DLC film coated plastic containers with high productivity, and by giving the external electrode a multiple-integrated structure, it is possible to reduce the number of external electrode structural components, build a compact apparatus by simplifying the structure, achieve easy maintenance, reduce the cost of the apparatus, and reduce the film thickness dispersion of the thin film formed inside the containers.

By the inventions of the apparatus for manufacturing DLC film coated plastic containers and the manufacturing method thereof, it becomes possible to further increase the number of plastic containers undergoing film formation at one time. In this regard, even when the number of plastic containers undergoing film formation at one time was increased, it was possible to prevent obstruction to the conveying in of plastic containers and the conveying out of DLC film coated plastic containers. Further, it was also possible to make the film forming portion smaller and reduce the cost of a manufacturing apparatus for mass production by using variable capacitors and using only one matching box. Further, it was also possible to precisely match the matching times by preventing lags in the matching times, and reduce the dispersion of the film thickness of the formed DLC films between containers.

By the inventions of the apparatus for manufacturing DLC film coated plastic containers and the manufacturing method thereof, it was possible to provide an apparatus for manufacturing DLC film coated plastic containers which has a simple structure and a manufacturing method thereof, wherein the connection between a multiple-integrated external electrode and a matching box, or the connection between multiple-integrated external electrodes and variable capacitors in the case where variable capacitors are used is carried out at a point equidistant from each plastic container when the plurality of plastic container housing spaces are arranged at equal distances on the same circle in the same cross section of the multiple-integrated columnar external electrode, namely, at the center of such circle. Of course, by carrying out the connections described above, it was possible to make it unnecessary for the multiple-integrated external electrode to carry out the adjustment of the power distribution between each external electrode which is an essential requirement in the case where an external electrode is provided for each one container. For example, in the case where a connection between a multiple-integrated external electrode and a matching box is carried out, because power can be distributed uniformly from the connection point, it was possible to form DLC films uniformly in a plurality of plastic containers without the use of variable capacitors. On the other hand, even in the case where variable capacitors are used, it was possible to eliminate the need to provide the same number of variable capacitors as the number of plastic containers housed at one time by using the same number of variable capacitors as the number of multiple-integrated external electrodes.

Figure 1:
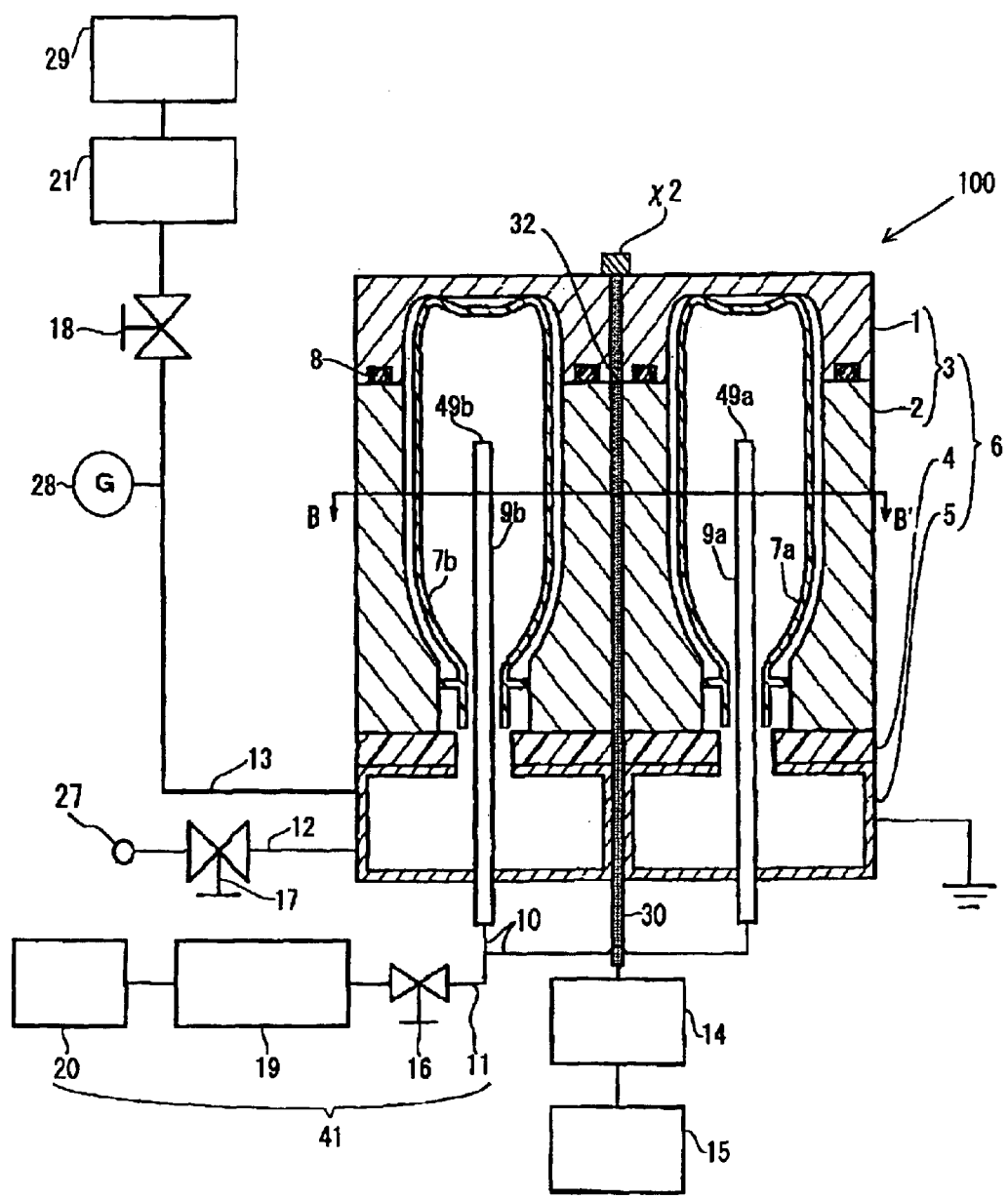
FIG. 1 is a block diagram schematically showing an apparatus for manufacturing DLC film coated plastic containers which can simultaneously coat four plastic containers.

The meanings of the reference characters shown in FIGS. 1~6 are described below. The characters 1, 51a and 51b are container lower portion external electrodes, the characters 2, 52a and 52b are container upper portion external electrodes, the characters 3, 53a and 53b are external electrodes, the characters 4, 54a and 54b are insulating members, the characters 5, 55a and 55b are cover portions, the characters 6, 56a and 56b are vacuum chambers, the characters 7a, 7b, 7c, 7d, 57a, 57b, 57c, 57d, 57e, 57f, 57g and 57h are PET bottles, the character 8 is an O-ring, the characters 9a, 9b, 9c, 9d, 59a, 59b, 59e and 59f are internal electrodes, the characters 10, 11, 12, 13, 60, 61 and 63 are pipelines, the characters 14 and 64 are matching boxes, the characters 15 and 65 are high-frequency power supplies (RF power supplies), the characters 16, 17, 18, 66, 67 and 68 are vacuum valves, the characters 19 and 69 are mass flow controllers, the characters 20 and 70 are source generating sources, the characters 21 and 71 are vacuum pumps, the characters 27 and 77 are leak gas (air) supply sources, the characters 28 and 78 are vacuum gauges, the characters 29 and 79 are exhaust ducts, the characters 30, 80a and 80b are high-frequency output supply rods, the character 32 is a high-frequency output supply rod connection contact, the characters 41 and 91 are source gas introduction means, the characters 49a and 49b are gas blow out openings, the characters 81a and 81b are variable capacitors, the character 100 is a DLC film coated plastic container manufacturing apparatus having one multiple-integrated external electrode capable of forming a film simultaneously in four containers, the character 200 is a DLC film coated plastic container manufacturing apparatus having two multiple-integrated external electrodes each capable of forming a film simultaneously in four containers, the character x1 is the center of the multiple-integrated external electrode, the characters x2, x3 and x4 are high-frequency output supply points, the character X is the center axis of the multiple-integrated external electrode, the characters 7ax, 7bx, 7cx and 7dx are the center points of the housing spaces of the PET bottles 7a~7d.

PREFERRED EMBODIMENTS OF THE INVENTION

The preferred embodiments of the present invention will be described is with reference to FIGS. 1~6. The apparatus for manufacturing DLC film coated plastic containers according to the preferred embodiments of the present invention is an apparatus which uses a plasma CVD method to form a DLC film or a DLC film containing Si or the like to the inside of a container or the like. The present invention is not limited to the preferred embodiments described below, and it is possible to make appropriate changes within a range in which the effect of the present invention is achieved.

First Embodiment

Figure 2:
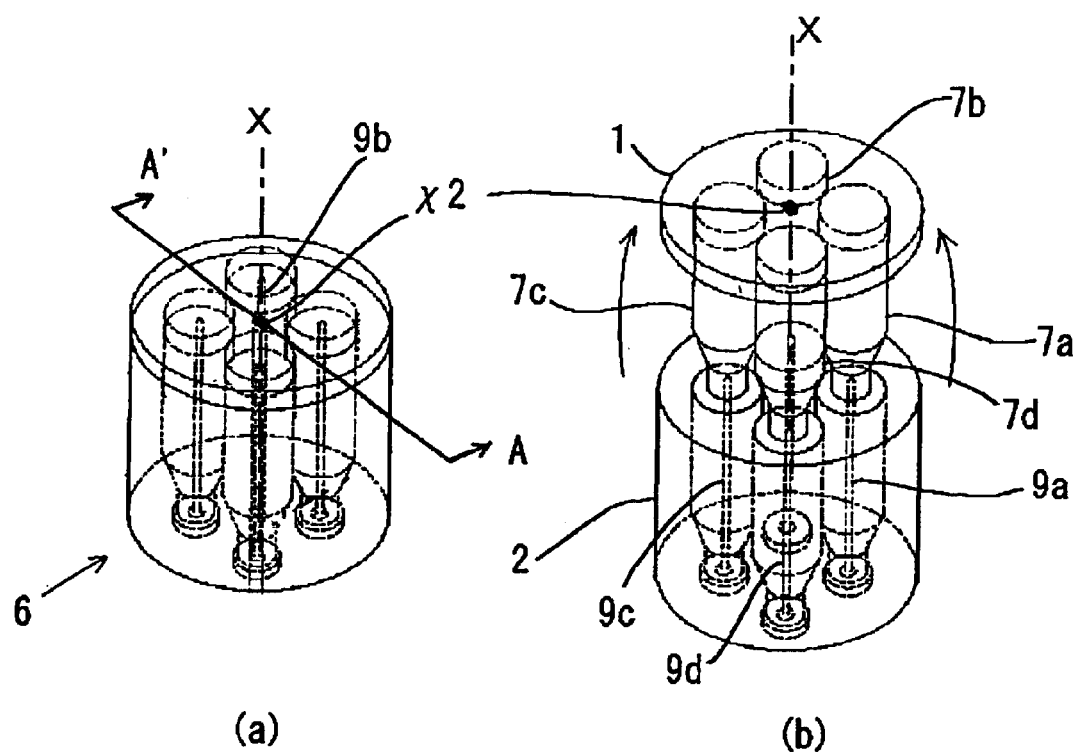
FIG. 2 are drawings which schematically shows the multiple-integrated external electrode of the vacuum chamber in FIG. 1, in which (a) shows the case where the external electrode is closed, and (b) shows the case where the external electrode is open.

The embodiment for the case of one multiple-integrated external electrode will be described. FIG. 1 is a block diagram schematically showing an apparatus 100 for manufacturing DLC film coated plastic containers which can simultaneously coat four plastic containers. FIG. 2 is a drawing which schematically shows the external electrode of a vacuum chamber 6 of FIG. 1 which is formed from an external electrode 3, an insulating member 4, and a cover portion 5 and the like.

The apparatus 100 for manufacturing DLC film coated containers according to the present invention is equipped with the external electrode 3, internal electrodes 9a~9d, source gas introduction means 41, a matching box 14, and a high-frequency power supply 15.

The vacuum chamber 6 is formed by the external electrode 3 together with the electrically conductive cover portion 5 and the insulating member 4. The insulating member 4 is arranged on top of the cover portion 5, and the external electrode 3 is arranged on top of the insulating member 4. The external electrode 3 is formed from a container upper portion external electrode 2 and a container lower portion external electrode 1, and is constructed so that the upper portion of the container lower portion external electrode 1 is removably mounted to the upper portion of the container upper portion external electrode 2 via an O-ring 8. Further, the external electrode 3 is insulated from the cover portion 5 by the insulating member 4.

Further, the external electrode 3 of FIG. 1 is shown as a vertical cross section taken along lines A–A' of the vacuum chamber 6 of FIG. 2, and the apparatus 100 for manufacturing DLC film coated plastic containers is a manufacturing apparatus capable of forming a DLC film on four plastic containers at one time.

Further, in the present embodiment, the external electrode 3 is divided into the two electrodes of the container lower portion external electrode 1 and the container upper portion external electrode 2, but in order to make the DLC film have a uniform thickness or the like, the external electrode may be divided into three electrodes such as a bottom portion electrode, a trunk portion electrode and a shoulder portion electrode, for example, or into more than three electrodes, wherein each electrode is sealed by the interposing of O-rings, for example, and electrically insulated by Teflon sheets or polyimide films.

The external electrode in the present embodiment is a cylindrical columnar external electrode, but it is also possible to use an external electrode having the shape of a square column or a columnar structure formed from a single columnar body and formed by combining shapes which surround each container housing space with an approximately uniform thickness.

Figure 3:
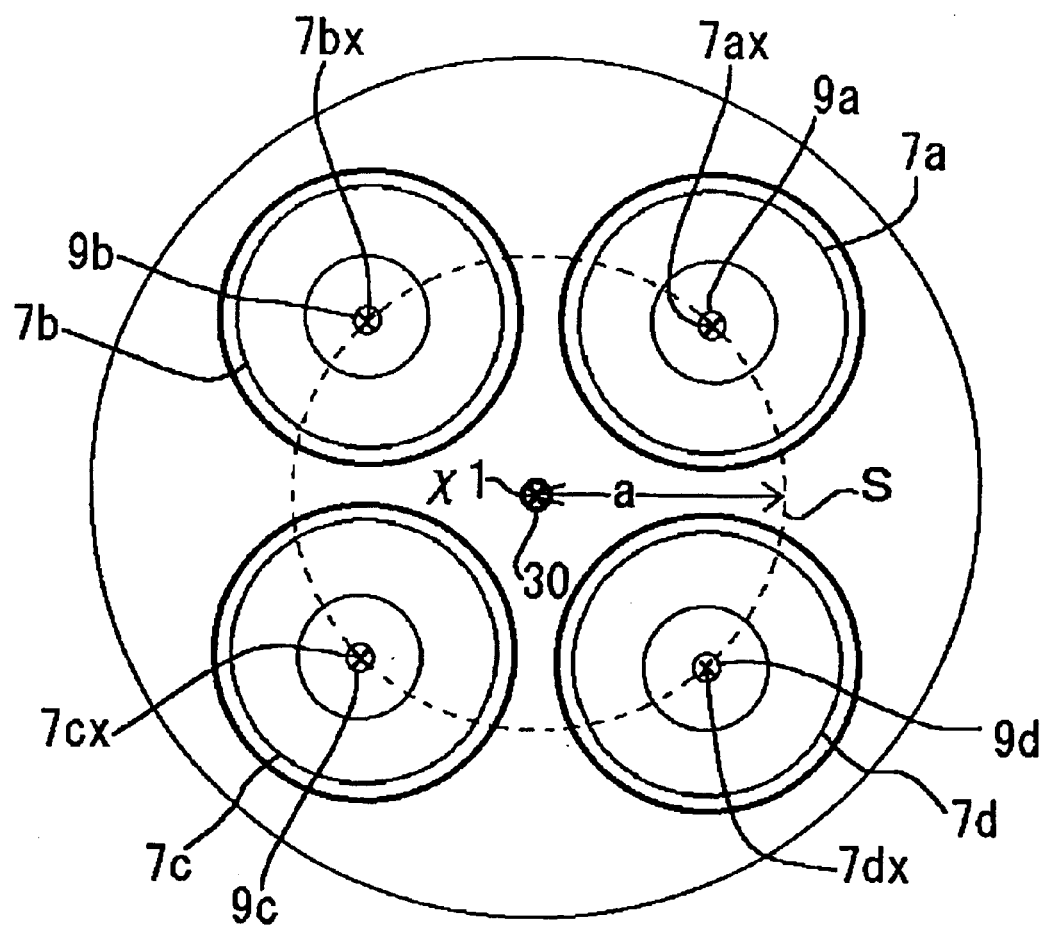
FIG. 3 is a horizontal cross-sectional view taken along lines B–B' of the multiple-integrated external electrode.

As shown in FIG. 2, four spaces are formed inside the external electrode 3 to obtain a multiple-integrated structure, and these spaces house four plastic containers which are the coating objects, for example, PET bottles 7a~7d formed from polyethylene terephthalate resin. The housing spaces inside the external electrode 3 are formed to be slightly larger than the outside shape of the PET bottles 7a~7d housed therein, and each of these spaces is formed to be an independent housing space. As shown in FIG. 3 which is a horizontal cross-sectional view taken along lines B–B' of FIG. 1, the independent housing spaces are arranged so that the centers 7ax~7dx (each of which is a point shown by x) of the housing spaces of the PET bottles 7a~7d are arranged at equal spacings on a circle S having a radius a from the center X1 of the external electrode. A high-frequency output is introduced to a high-frequency output supply rod 30. In this regard, if the centers 7ax~7dx are not arranged at equal spacings, a high-frequency output described later can not be distributed equally to each of the containers.

As shown in FIG. 1, open portions connected to the spaces inside the external electrode 3 are provided in the insulating member 4 and the cover portion 5. Further, spaces are provided inside the cover portion 5, and these spaces are connected to the inside of the external electrode 3 via the open portions described above. The spaces inside the external electrode 3 are sealed from the outside by the O-ring 8 arranged between the container upper portion external electrode 2 and the container lower portion external electrode 1.

The container lower portion external electrode 1 of the external electrode 3 is connected to the matching box 14 via the high-frequency output supply rod 30, wherein the intersection x2 of the center axis X and the bottom surface of the container lower portion external electrode 1 of the external electrode 3 shown in FIG. 2 acts as a high-frequency output supply point. The matching box 14 is connected to the high-frequency power supply 15 via a coaxial cable. An electrically conductive cable and an electrically conductive metal rod are used in the high-frequency output supply rod 30. Further, a high-frequency output supply rod connection contact 32 functions as a conductive contact point in the case where the container lower portion external electrode and the container upper portion external electrode are assembled at the time containers are put in and taken out.

Further, in the present embodiment, the high-frequency output supply point x2 is provided in the container lower portion external electrode, but it is also possible to provided connection points distributed at four places in the container lower portion external electrode 1 near the bottom surface of each plastic container, or it is possible to make a connection or the like at the center axis X inside the external electrode. In any case, the change of the connection point can be appropriately carried out within a range that makes it possible to generate a uniform plasma inside each plastic container.

As shown in FIG. 1, the internal electrodes 9a~9d are arranged inside the external electrode 3, and are arranged inside the PET bottles 7a~7d. Namely, the internal electrodes 9a~9d are inserted from the cover portion 5 through the space inside the cover portion 5 and the open portions of the cover portion 5 and the insulating member 4 into the spaces inside the external electrode 3. Namely, the bases of the internal electrodes 9a~9d are arranged in the cover portion 5, and the tips of the internal electrodes 9a~9d are arranged inside the PET bottles 7a~7d housed inside the external electrode 3 in the spaces inside the external electrode 3. The internal electrodes 9a~9d have tubular shapes that are hollow inside. Gas blow out openings 49a~49d are provided in the tips of the internal electrodes 9a~9d. The internal electrodes 9a~9d are grounded.

Figure 4:
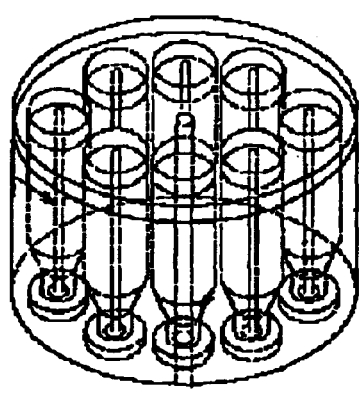
FIG. 4 are drawings which schematically show the structure of an external electrode in the case where eight plastic containers can be housed inside one multiple-integrated external electrode, in which (a) shows the case where the multiple-integrated external electrode is closed, and (b) shows the case where the multiple-integrated external electrode is open.
Figure 4:
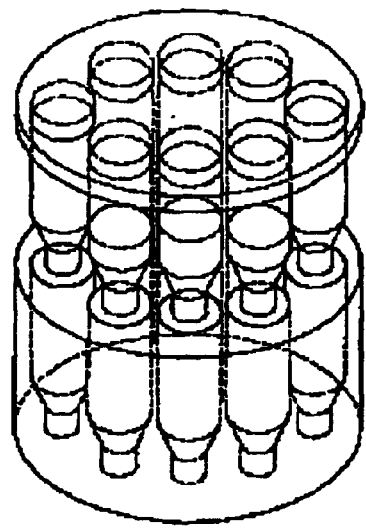

Further, in the present embodiment, a description was given for the case where four plastic containers are housed inside one external electrode, but it is also possible to construct an embodiment which uses an external electrode capable of housing two or more plastic containers, such as the eight plastic containers shown in FIG. 4, for example. However, the case of four plastic containers like that of the present embodiment is the most preferred because there is no need to carry out realignment at the time the PET bottles after DLC film formation are conveyed out from the apparatus 100 for manufacturing DLC film coated plastic containers, and placed in a lattice-shaped conveying box riding on a conveyor.

The source gas introduction means 41 introduces a source gas supplied from a source gas generating source 20 to the inside of the PET bottles 7a~7d. Namely, one side of a pipeline 10 is connected to the bases of the inside electrodes 9a~9d, and the other side of the pipeline 10 is connected to a pipeline 11 which is connected to a vacuum valve 16 and a mass flow controller 19. The mass flow controller 19 is connected to the source gas generating source 20. The source gas generating source 20 generates a hydrocarbon gas or the like such as acetylene or the like.

The spaces inside the cover portion are connected to one side of a pipeline 12, and the other side of the pipeline 12 is in a state open to the atmosphere via a vacuum valve 17. Further, the spaces inside the cover portion are connected to one side of a pipeline 13, and the other side of the pipeline 13 is connected to a vacuum pump 21 via a vacuum valve 18. The vacuum pump 21 is connected to an exhaust duct 29. Further, a vacuum gauge 28 is provided in the pipeline 13.

Next, a description will be given for a method of forming a DLC film inside containers using the apparatus 100 for manufacturing DLC film coated plastic containers shown in FIG. 1.

First, the vacuum valve 17 is opened to open the inside of the vacuum chamber 6 to the air. In this way, air passes through the pipeline 12 and enters the spaces inside the cover portion 5 and the spaces inside the external electrode 3, whereby the inside of the vacuum chamber 6 reaches atmospheric pressure. Next, the container lower portion external electrode 1 is removed from the container upper portion external electrode 2, and the PET bottles 7a~7d are inserted and arranged in the spaces inside the container upper portion external electrode 2. At this time, the internal electrodes 9a~9d become inserted into the inside of the PET bottles 7a~7d. Next, the container lower portion external electrode 1 is mounted to the container upper portion external electrode 2, and the external electrode 3 is sealed by the O-ring 8.

Then, after the vacuum valve 17 is closed, the vacuum valve 18 is opened, and the vacuum pump 21 is operated. In this way, air is exhausted from the inside of the vacuum chamber (i.e., the spaces inside the external electrode 3 and the spaces inside the cover portion 5) including the inside of the PET bottles 7a~7d, whereby a vacuum is created inside the external electrode 3. The pressure inside the vacuum chamber 6 at this time is a sufficiently low pressure compared with the film formation time, such as $5.0 \times 10^{-3}$~$1.0 \times 10^{-1}$ Torr, for example.

Next, the vacuum valve 16 is opened, acetylene gas is generated in the source gas generating source 20, the acetylene gas is introduced to the inside to the pipeline 11, and then the acetylene gas which undergoes flow rate control by the mass flow controller 19 passes through the pipeline 10 and the internal electrodes 9a~9d and is blown out from the gas blow out openings 49a~49d. In this way, the acetylene gas is introduced to the inside of the PET bottles 7a~7d. Then, by balancing the controlled gas flow rate and the air exhaust performance, the inside of the vacuum chamber 6 and the inside of the PET bottles 7a~7d are maintained at a pressure suitable for forming a DLC film (e.g., about 0.05~0.50 Torr).

Then, a high-frequency output (e.g., 13.56 MHz) is supplied from the high-frequency power supply 15 via the matching box 14 and the high-frequency output supply rod 30 connected to the external electrode 3. The high-frequency output is 300~3,000 W, for example. In this way, a plasma is generated between the external electrode 3 and the internal electrodes 9a~9d. At this time, a uniform acetylene type plasma is generated between the internal electrodes 9a~9d arranged at equal distances from the high-frequency output supply point and each PET bottle housing space inside the external electrode, whereby a uniform DLC film is formed on each inside surface of the PET bottles 7a~7d. Further, the matching box 14 matches the impedance of the external electrode and the internal electrodes by the inductance L and the capacitance C. The film formation time at this time becomes short with about several seconds being required.

Next, the high-frequency output from the high-frequency power supply 15 is stopped, and the vacuum valve 16 is shut to stop the supply of the source gas. Then, the vacuum valve 18 is opened, and the acetylene gas inside the vacuum chamber 6 and inside the PET bottles 7a~7d is exhausted by the vacuum pump 21. Next, the vacuum valve 18 is shut. The vacuum inside the vacuum chamber at this time is $5.0 \times 10^{-3}$~$5.0 \times 10^{-2}$ Torr, for example. Then, the vacuum valve 17 is opened to open the inside of the vacuum chamber 6 to the atmosphere, and by repeating the film forming method described above, a DLC film is formed inside a plurality of PET bottles.

Second Embodiment

The embodiment for the case of two multiple-integrated external electrodes will be described. Further, in the present invention, it is possible to construct embodiments in which such arrangement is expanded in a parallel manner in the same way even for the case of three or more multiple-integrated external electrodes.

Figure 5:
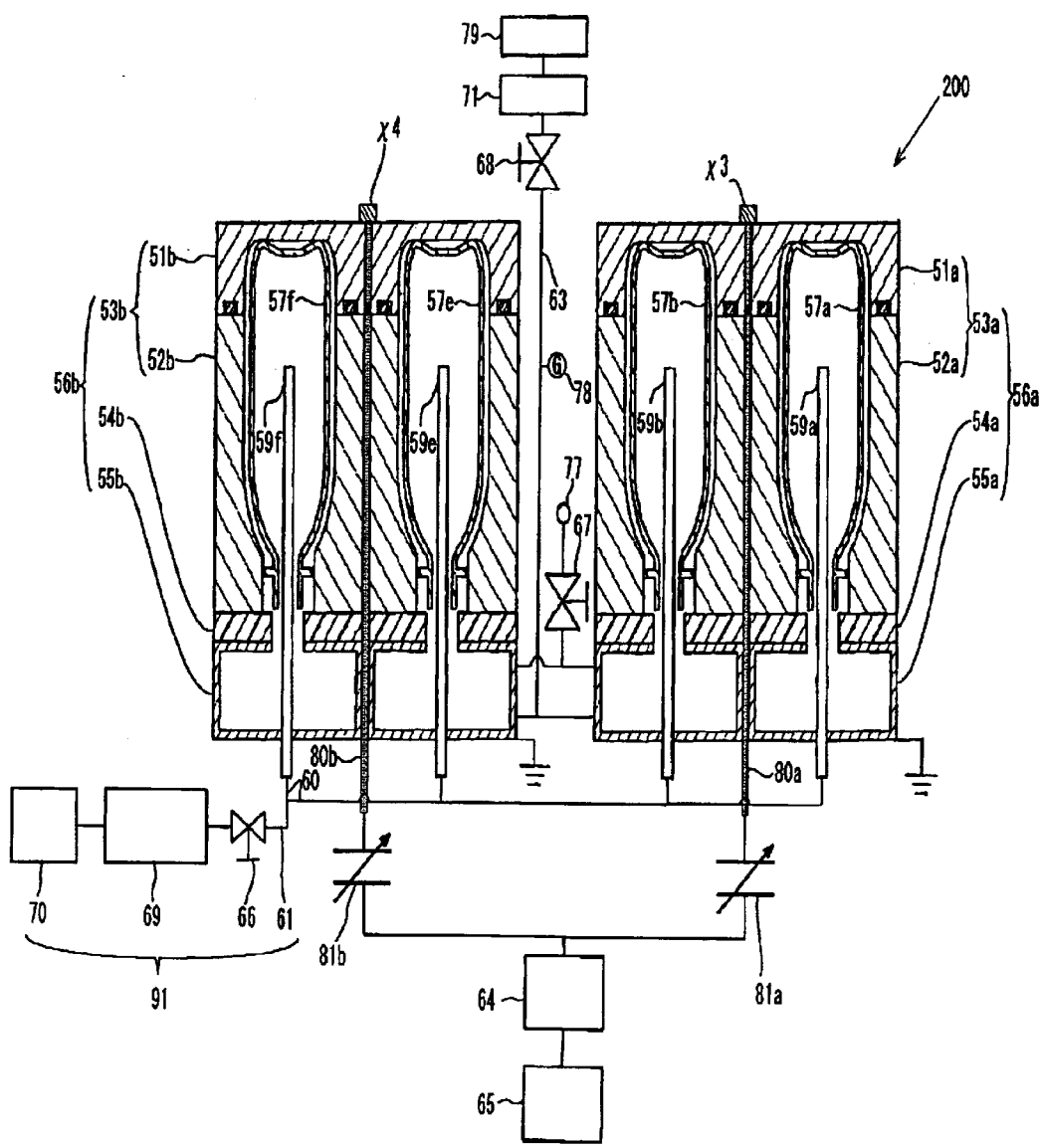
FIG. 5 a block diagram schematically showing an apparatus for manufacturing DLC film coated plastic containers in the case where two multiple-integrated external electrodes are provided, wherein four plastic containers can be housed per one external electrode.
Figure 6:
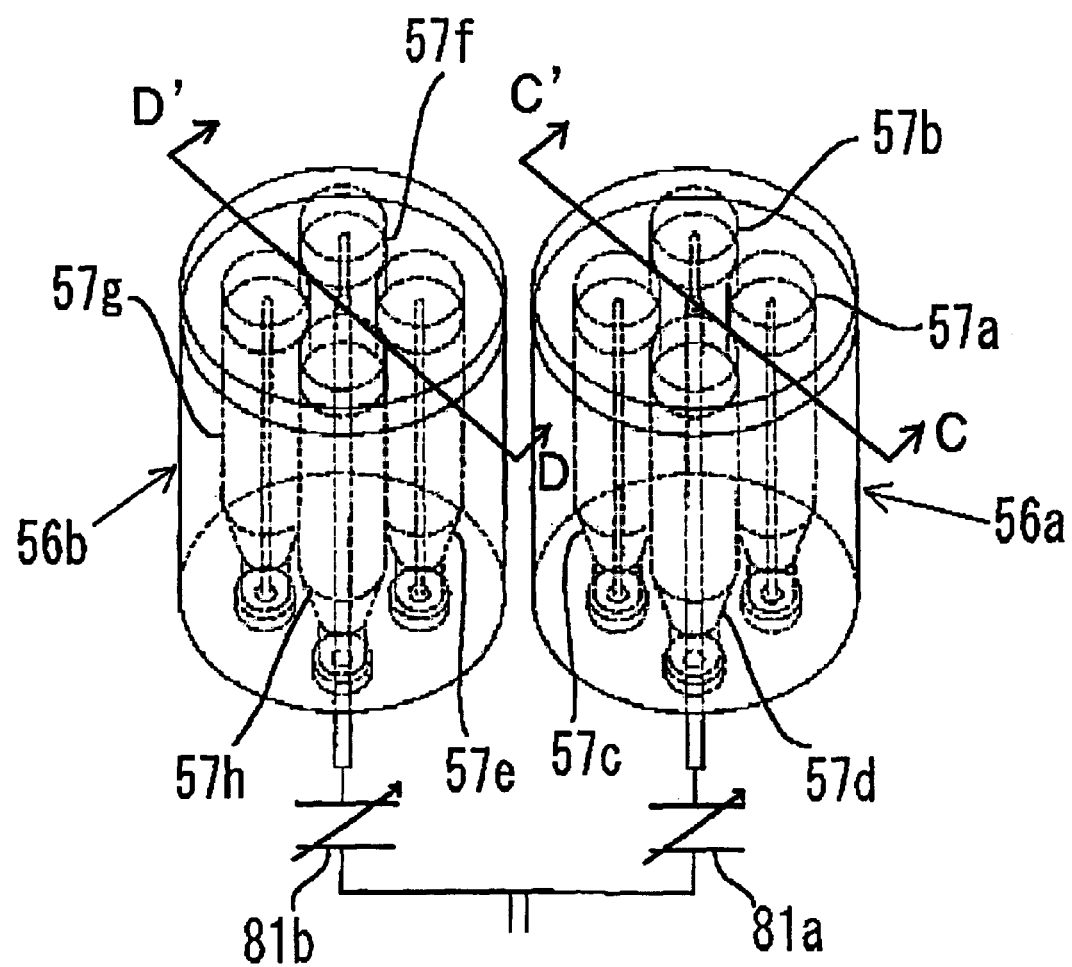
FIG. 6 is a drawing which schematically shows the external electrodes of the vacuum chamber in FIG. 5.

FIG. 5 a block diagram schematically showing an apparatus 200 for manufacturing DLC film coated plastic containers in the case where two multiple-integrated external electrodes are provided, wherein four plastic containers can be housed per one external electrode. FIG. 6 is a drawing which schematically shows the external electrodes of the vacuum chamber in FIG. 1.

The apparatus 200 for manufacturing DLC film coated plastic containers according to the present invention is equipped with external electrodes 53a, 53b, internal electrodes 59a~59h, source gas introduction means 91, variable capacitors 81a, 81b, a matching box 64, and a high-frequency power supply 65.

Further, the external electrodes of FIG. 5 are shown as a vertical cross section taken along lines C–C' of a vacuum chamber 56a and a vertical cross section taken along lines D–D' of a vacuum chamber 56b of FIG. 6, and the apparatus 200 for manufacturing DLC film coated plastic containers is a manufacturing apparatus capable of forming a DLC film on eight plastic containers at one time.

Each of the external electrodes 53a, 53b is the same as the external electrode 3 described in the first embodiment. The external electrode in the present embodiment is a cylindrical columnar external electrode, but it is also possible to use an external electrode having the shape of a square column or a columnar structure formed from a single columnar body and formed by combining shapes which surround each container housing space with an approximately uniform thickness. Now, because PET bottles 57a~57h are housed four to each external electrode, it is possible to form a film in a total of eight containers by the same film forming process.

Container lower portion external electrodes 51a, 51b of the external electrodes 53a, 53b are connected to the respective variable capacitors 81a, 81b via high-frequency output supply rods 80a, 80b at respective high-frequency output supply points x3, x4 in the same way as the case of the first embodiment, the variable capacitors 81a, 81b are connected to the one matching box 64, and the matching box 64 is connected to the high-frequency power supply 65 via a coaxial cable. Further, in the present embodiment, the high-frequency output supply points x3, x4 are connected to each container lower portion external electrode, but it is possible to make changes in the same way as the first embodiment, such as making connections distributed at four places near the bottom surface of each plastic container, or making connections inside each external electrode or the like.

The variable capacitors 81a, 81b function as adjustment mechanisms for distributing a high-frequency output equally to each external electrode.

The internal electrodes 59a~59h, the source gas introduction means 91, the matching box 66, the high-frequency power supply 67 and the other elements are the same as those of the case of the first embodiment.

Next, a description will be given for a method of forming a DLC film inside containers using the apparatus 200 for manufacturing DLC film coated plastic containers shown in FIG. 5, but because the present embodiment has two external electrodes compared with the first embodiment, and has the special feature of being equipped with variable capacitors, a description will be given for the difference of the method of forming a film with these.

The vacuum forming process and the source material introduction process are the same as those of the first embodiment, and after these processes have been carried out, a plasma generating process, namely, a DLC film forming process is carried out. Namely, a high-frequency output (e.g., 13.56 MHz) is supplied from the high-frequency power supply 65 via the matching box 64 and the high-frequency output supply rods 80a, 80b connected to the external electrodes 53a, 53b. The high-frequency output is 300~3,000 W, for example. In this way, a plasma is generated between the external electrodes 53a, 53b and the internal electrodes 59a~59h. At this time, at each of the external electrodes 53a, 53b, a uniform acetylene type plasma is generated between the internal electrodes arranged at equal distances from the high-frequency output supply point and the PET bottle housing spaces inside the external electrode, and the variable capacitors 81a, 81b are adjusted so that no difference arises in the generation of plasma between the two external electrodes. Namely, adjustments are carried out so that a uniform plasma is generated inside the eight containers. By this operation, a uniform DLC film is formed on each inside surface of the PET bottles 57a~57h.

Then, by repeatedly carrying out a high-frequency output stopping process, a plastic container removing process and all the processes described above, the film formation operation can be continuously carried out in the same way as that of the first embodiment.

The present invention is not limited to the first and second embodiments described above, and it is possible to make various changes thereto. For example, the source gas generating source is not limited to a hydrocarbon gas generating source, and it is possible to use various generating sources, for example, it is possible to use a hydrocarbon type gas containing Si.

Further, in the first and second embodiments, the high-frequency output supply rods pass through the inside of the external electrodes, but because connections may be made with just the high-frequency output supply points, the high-frequency output supply rods may be provided outside the external electrodes. Further, the containers inside the vacuum chambers were arranged with the openings pointing downward, but it is also possible to employ a manufacturing apparatus structure in which the openings point upward.

Further, in the first and second embodiments, PET bottles for beverages are used as containers in which a thin film is formed inside, but it is also possible to use containers used for other uses.

Further, in the first and second embodiments, a DLC film or a DLC film containing Si is formed as a thin film, but it is also possible to use the DLC film coated plastic container manufacturing apparatus according to the present invention at the time other thin films are formed inside containers.

What is claimed is:

1. An apparatus for manufacturing DLC film coated plastic containers which simultaneously forms a DLC (Diamond Like Carbon) film on the inside surfaces of a plurality of plastic containers, comprising:

a columnar external electrode which includes housing spaces capable of housing said plurality of plastic containers in parallel in respective independently housed states, and is a columnar external electrode formed from a single columnar body in which the inner wall surface of each of said housing spaces is shaped to surround the vicinity of the outside each of said plastic container, wherein the center axis of each of said housing spaces is parallel to the center axis of said columnar external electrode, and is positioned on the same circle in the same cross section of said columnar external electrode, and wherein said fellow housing spaces are arranged at equal spacings;

internal electrodes respectively arranged inside said plurality of plastic containers housed in the housing spaces of said columnar external electrode;

source gas introduction means which introduces a source gas inside each of said plurality of plastic containers;

a matching box which carries out impedance matching of high-frequency loads connected to said columnar external electrode; and a high-frequency power supply connected to said matching box.

2. The apparatus for manufacturing DLC film coated plastic containers of claim 1, wherein the output side of said matching box is connected at the center axis of the columnar external electrode.

3. An apparatus for manufacturing DLC film coated plastic containers which simultaneously forms a DLC film on the inside surfaces of a plurality of plastic containers, comprising:

a plurality of columnar external electrodes which include housing spaces capable of housing said plurality of plastic containers in parallel in respective independently housed states, each of said columnar external electrodes being formed from a single columnar body in which the inner wall surface of each of said housing spaces is shaped to surround the vicinity of the outside of each said plastic container, wherein the center axis of each of said housing spaces is parallel to the center axis of each said columnar external electrode, and is positioned on the same circle in the same cross section of said columnar external electrode, and wherein said fellow housing spaces are arranged at equal spacings;

internal electrodes respectively arranged inside said plurality of plastic containers housed in the housing spaces of said columnar external electrodes;

source gas introduction means which introduces a source gas inside each of said plurality of plastic containers;

variable capacitors connected to each of said columnar external electrodes;

one matching box which carries out impedance matching of high-frequency loads connected to said variable capacitors; and a high-frequency power supply connected to said matching box;

wherein the matching box carries out impedance matching of all of said plurality of columnar external electrodes, and the variable capacitors carry out distribution of a high-frequency output supplied to each of said columnar external electrodes by the high-frequency power supply.

4. The apparatus for manufacturing DLC film coated plastic containers of claim 3, wherein the output sides of said variable capacitors are connected at the center axes of the columnar external electrodes.

5. A method of manufacturing DLC film coated plastic containers which simultaneously forms a DLC film on the inside surfaces of a plurality of plastic containers, comprising the steps of:

supplying a uniformly distributed high-frequency output to housing spaces provided in a columnar external electrode which includes said housing spaces capable of housing said plurality of plastic containers in parallel in respective independently housed states, said columnar external electrode being formed from a single columnar body in which the inner wall surface of each of said housing spaces is shaped to surround the vicinity of the outside of each said plastic container, wherein the center axis of each of said housing spaces is parallel to the center axis of said columnar external electrode, and is positioned on the same circle in the same cross section of said columnar external electrode, and wherein said fellow housing spaces are arranged at equal spacings; and generating a source gas type plasma between said columnar external electrode and grounded internal electrodes respectively arranged inside said plurality of plastic containers housed in the housing spaces of said columnar external electrode.

6. The method of manufacturing DLC film coated plastic containers of claim 5, wherein the high-frequency output is supplied at the center axis of said columnar external electrode.

7. A method of manufacturing DLC film coated plastic containers which simultaneously forms a DLC film on the inside surfaces of a plurality of plastic containers, comprising the steps of:

supplying a uniformly distributed high-frequency output to each of a plurality of columnar external electrodes which include housing spaces capable of housing said plurality of plastic containers in parallel in respective independently housed states, each of said columnar external electrodes being formed from a single columnar body in which the inner wall surface of each of said housing spaces is shaped to surround the vicinity of the outside of each said plastic container, wherein the center axis of each of said housing spaces is parallel to the center axis of each said columnar external electrode, and is positioned on the same circle in the same cross section of said columnar external electrode, and wherein said fellow housing spaces are arranged at equal spacings;

supplying the uniformly distributed high-frequency output to said housing spaces provided in each of said columnar external electrodes; and generating a source gas type plasma between each of said columnar external electrodes and grounded internal electrodes respectively arranged inside said plurality of plastic containers housed in the housing spaces of said columnar external electrodes.

8. The method of manufacturing DLC film coated plastic containers of claim 7, wherein the supply and distribution of the high-frequency output to each of said columnar external electrodes is carried out via variable capacitors, and the supply and distribution of the high-frequency output to each plastic container housing space is carried out at the center axis of said columnar external electrodes.

9. A method of manufacturing DLC film coated plastic container which simultaneously forms a DLC film on the inside surfaces of a plurality of plastic containers, comprising the steps of:

supplying a high-frequency output to a columnar external electrode which includes housing spaces capable of housing said plurality of plastic containers in parallel in respective independently housed states, said columnar external electrode being formed from a single columnar body in which the inner wall surface of each of said housing spaces is shaped to surround the vicinity of the outside of each said plastic container, wherein the center axis of each of said housing spaces is parallel to the center axis of said columnar external electrode, and is positioned on the same circle in the same cross section of said columnar external electrode, and wherein said fellow housing spaces are arranged at equal spacings;

supplying the uniformly distributed high-frequency output to said housing spaces provided in said columnar external electrode; and generating a source gas type plasma between said columnar external electrode and grounded internal electrodes respectively arranged inside said plurality of plastic containers housed in the housing space of said columnar external electrode.

* * * * *